(12) United States Patent
Morel

(10) Patent No.: US 6,362,673 B1
(45) Date of Patent: Mar. 26, 2002

(54) PROCESS FOR CONVERTING AN ANALOGUE SIGNAL INTO A RECTANGULAR SIGNAL AND DEVICE FOR IMPLEMENTING THIS PROCESS

(75) Inventor: Philippe Morel, Rennes (FR)

(73) Assignee: Thomson Licensing S.A., Boulogne (FR)

( * ) Notice: Subject to any disclaimer, the term of this patent is extended or adjusted under 35 U.S.C. 154(b) by 0 days.

(21) Appl. No.: 09/447,001

(22) Filed: Nov. 22, 1999

(30) Foreign Application Priority Data

Nov. 30, 1998 (FR) .............................. 98 15055

(51) Int. Cl.$^7$ ................................. H03K 5/22
(52) U.S. Cl. ......................................... 327/172; 327/72
(58) Field of Search .............................. 327/58, 60, 62, 327/63, 68, 71, 72, 74, 75, 77, 172, 176, 178; 341/52, 56

(56) References Cited

U.S. PATENT DOCUMENTS

| | | | | |
|---|---|---|---|---|
| 4,063,235 A | * | 12/1977 | Ludwing | 340/347 DD |
| 4,803,710 A | | 2/1989 | Elabd | 377/60 |
| 5,003,196 A | * | 3/1991 | Kawaguchi | 327/62 |
| 5,142,554 A | * | 8/1992 | Stribling et al. | 375/76 |
| 5,214,319 A | | 5/1993 | Abdi | 327/58 |
| 5,274,273 A | | 12/1993 | Baginski et al. | 327/72 |
| 5,446,763 A | * | 8/1995 | Baum et al. | 375/340 |
| 5,614,905 A | * | 3/1997 | Crane | 341/146 |
| 5,731,719 A | * | 3/1998 | Wang et al. | 327/76 |

FOREIGN PATENT DOCUMENTS

| | | | | |
|---|---|---|---|---|
| EP | 0782264 A2 | 4/1997 | | H03K/5/08 |
| GB | 2172467 A | 9/1986 | | H04N/1/40 |
| WO | WO 84/00452 | 2/1984 | | H03K/5/153 |

* cited by examiner

*Primary Examiner*—Tuan T. Lam
(74) *Attorney, Agent, or Firm*—Joseph S. Tripoli; Robert D. Shedd

(57) ABSTRACT

The invention relates to a process for converting, by virtue of a threshold, a signal exhibiting alternating rising and falling transitions, into a rectangular signal, wherein the threshold is determined on each transition of the signal to be converted. A device for implementing the process comprises a delay line, whose input receives the signal to be converted by way of an impedance equal to the characteristic impedance of the line, and a comparator whose inputs are linked respectively to the input and to the output of the line.

15 Claims, 4 Drawing Sheets

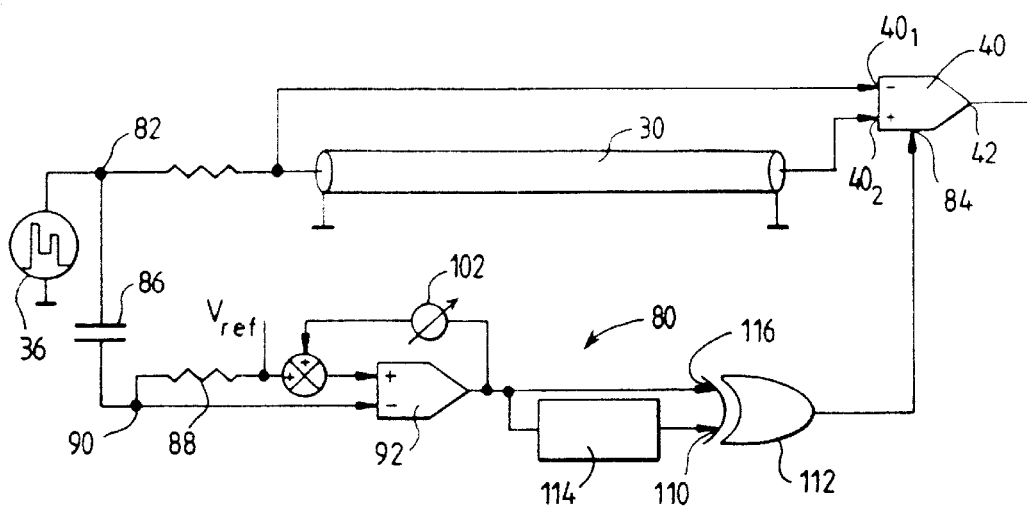
FIG.7
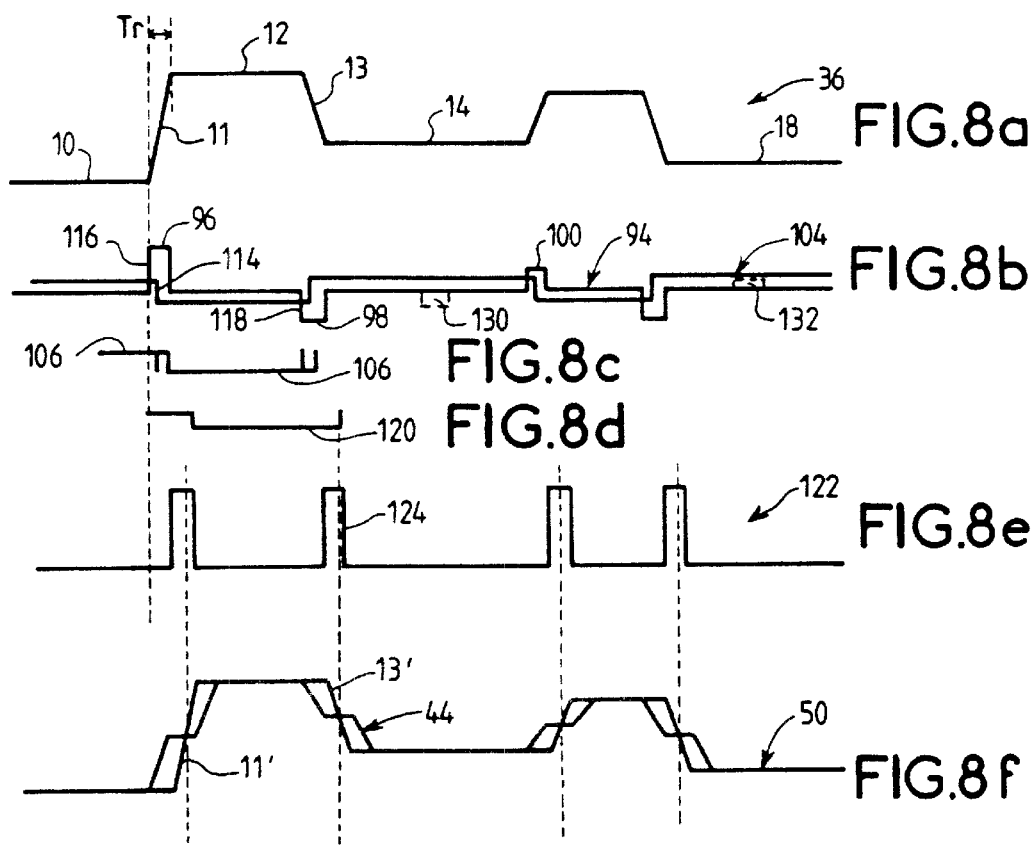
FIG.8a
FIG.8b
FIG.8c
FIG.8d
FIG.8e
FIG.8f

PROCESS FOR CONVERTING AN ANALOGUE SIGNAL INTO A RECTANGULAR SIGNAL AND DEVICE FOR IMPLEMENTING THIS PROCESS

FIELD OF THE INVENTION

The invention relates to a process for converting an analogue signal into a logic signal.

A logic signal is a rectangular signal which can take two values only, a low value and a high value. The operation of converting an analogue signal into a logic signal consists in comparing at each instant the value of the analogue signal with a threshold and in imparting the low value when the analogue signal is less than the threshold and the high value when the analogue signal exhibits a value greater than the threshold.

The threshold is an analogue level which depends on the characteristics of the analogue input signal, for example the average value of the signal or the average of the peak amplitudes (maximum and minimum).

This conversion operation presents no difficulty when the average value of the analogue signal is constant. It is also known to adapt the threshold to slow fluctuations of the analogue signal. On the other hand, the conversion processes used hitherto do not make it possible to adapt to fast and/or frequent fluctuations of the amplitudes of analogue signals. In particular, the signals emanating from computer graphics cards or workstations deliver analogue signals whose amplitude transitions are variable.

SUMMARY OF THE INVENTION

The invention is characterized in that the optimum comparison threshold allowing the transformation of this analogue signal into a logic signal is determined in a quasi-instantaneous manner and for each transition of the analogue signal.

In one embodiment for which the analogue signal exhibits porches separated by alternating rising and falling transitions, with rise or fall time Tr, upon the appearance of the porch immediately following the transition, the threshold is determined, this being an average value of the amplitudes of the two porches on either side of the transition, this threshold being maintained for a first duration Tm, and the analogue signal to be converted is delayed by a second duration chosen such that Tm>Td so that the comparison threshold is present in the central region of the transition.

In this way, the rectangular signal (logic signal) can exhibit only a slight shift with respect to the analogue signal.

In a particularly simple mode of operation of this arrangement, the threshold signal is obtained by the addition of a first signal which is the signal to be converted and of a second signal, identical to this first signal, but delayed by twice the second duration (Td), the porch of the first signal before the transition having a level substantially equal to the level of the corresponding porch of the signal to be converted, and the porch of this first signal, after the transition, exhibiting a level substantially equal to the arithmetic mean of the levels of the porches of the signal to be converted on either side of the transition.

In this case, the threshold signal exhibits a stable porch between, on the one hand, the instant Tr where the analogue signal to be converted reaches the second porch and, on the other hand, the instant 2Td of the start of the second signal (added to the first). The analogue signal delayed by the duration Td is compared with the superposed signals between the instants Td and Td+Tr. Under these conditions, the comparison threshold signal does indeed exhibit, for the duration of the transition of the signal delayed by the duration Td, a stable porch.

For the implementation of this process, in a preferred embodiment, use is made of a transmission line (or delay line) which is not matched at its end and whose transmission duration, or delay of the line, has the value Td and the analogue signal to be converted is applied to the input of the line by way of a resistor of a value substantially equal to the characteristic impedance of the line.

In this embodiment, the addition signal appears at the input of the transmission line. Specifically, this input signal is the sum, on the one hand, of an incident wave in phase with the analogue input signal but of half the amplitude and, on the other hand, of a reflected wave which corresponds to this incident wave with a delay of duration 2Td. The reflected wave is due to the total reflection off the open circuit at the extremity of the line. Furthermore, the delayed signal appears at the extremity of the line. Thus, it is possible to make the comparison between the signal at the input of the line and the signal at the output of this line and the rectangular signal is the output signal from a comparator whose inputs receive these signals.

The transmission line can consist of a passive or active delay line, a coaxial cable, a strip line or a microstrip line.

Given that in order to transform an analogue signal into a logic signal, use is conventionally made of a comparator which delivers, on the one hand, a signal of a first value when the amplitude of a first input is greater than the amplitude of the second input and, on the other hand, a signal of a second value when the amplitude of the first input is less than that of the second input, it is preferable to make arrangements such that, outside of the transition periods, the signals to be compared exhibit substantially different amplitudes which confirm the output signal from the comparator.

For this purpose, in a first embodiment a shift is added to one of the signals to be compared, preferably the signal originating from the input of the line, this shift changing direction when the output signal from the comparator changes state.

In a second embodiment, the comparison is disabled outside of the periods of transition of the analogue signal to be converted.

The present invention provides a process for converting a signal exhibiting alternating rising and falling transitions, into a rectangular signal exhibiting a single low value and a single high value, the switchover from the low value to the high value, or conversely, occurring when the signal to be transformed exceeds a threshold or falls below the threshold, the threshold being determined on each transition of the signal to be converted.

According to one embodiment, since the signal to be converted exhibits porches between the transitions, a value which is substantially equal to the average of the amplitudes of the porches on either side of the transition is conferred on the threshold.

According to one embodiment, in order to determine the instant of transition from the low value to the high value, or vice versa, of the rectangular signal, on each transition of the signal to be converted, the value of the threshold is maintained for a first duration from the start of the porch of the signal to be converted which occurs after the transition, and this threshold is compared with the transition of the signal to be converted, delayed by a second duration, the first and second durations being chosen in such a way that the threshold appears in the middle region of the signal to be converted, delayed by the second duration.

According to one embodiment, the threshold is maintained up to an instant which corresponds to twice the second duration after the transition of the signal to be converted.

According to one embodiment, in order to produce the threshold, a signal is produced which is formed from the sum, on the one hand, of a first signal in phase with the signal to be converted, but of half the amplitude and, on the other hand, of a second signal identical to this first in-phase signal, but delayed by a duration which is greater than the largest of the durations of transition allowable for the signal to be converted.

The invention furthermore provides a device for implementing the process, which comprises:

a transmission line, or delay line, whose input receives the signal to be converted by way of an impedance of value substantially equal to the value of its characteristic impedance, and a comparator whose inputs are linked respectively to the input and to the output of the transmission line.

According to one embodiment, the device includes means for preventing the toggling of the signal on the output of the comparator outside of the periods of transition of the first delayed signal to be compared with the threshold.

According to one embodiment, a value is added to the signal on one of the inputs of the comparator, which value makes it possible to confirm the output signal from the comparator, outside of the periods of transition of the delayed signal to be converted.

According to one embodiment, a feedback circuit is provided between the output of the comparator and an input of this comparator.

According to one embodiment, the feedback circuit includes an attenuator, preferably adjustable.

According to one embodiment, the device includes a means for superimposing an offset signal onto the signal to be converted so that the values or shifts confirming the output signal from the comparator are substantially symmetric with respect to the average output signal from the comparator.

According to one embodiment, the device includes a means for allowing a toggling of the signal on the output of the comparator only during transitions of the delayed signal to be converted, the comparator being disabled outside of the periods of authorization, the signal on its outputs being unable to change state during the disabling periods.

According to one embodiment, the comparator is disabled in respect of a transition of the signal to be converted which has the same direction as the transition of an immediately preceding transition.

According to one embodiment, the comparator is disabled in respect of a transition for which the amplitude of the transition is less than a determined value.

According to one embodiment, the device includes a differentiator which differentiates the signal to be converted and a comparator for comparing the differentiated signal with a reference.

According to one embodiment, on the basis of the output signal from the comparator, a pulse for enabling the main comparator is created, this pulse having a startup instant and a duration which are such that the enabling of the main comparator occurs only during the periods of transition of the delayed signal to be converted.

According to one embodiment, in order to create an enabling pulse, an exclusive OR gate is provided, a first input of which is linked to the output of the comparator of the enabling circuit and the second input of which is linked to the output of this comparator of the enabling circuit by way of a delay element.

The present invention also provides an application of the process to the shaping of signals emanating from computer graphics cards or workstations.

BRIEF DESCRIPTION OF THE DRAWINGS

Other characteristics and advantages of the invention will become apparent with the description of some of its embodiments, this being given whilst referring to the appended drawings in which:

FIG. 7 is a diagram similar to that of FIG. 1 but in respect of another variant, and FIGS. 8a to 8f are charts serving to explain the manner of operation of the device represented in FIG. 7.

DESCRIPTION OF PREFERRED EMBODIMENTS

Figure 4A:
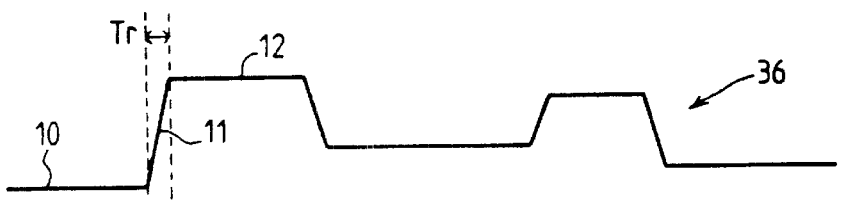
FIGS. 4a to 4c are charts illustrating the manner of operation of the device of FIG. 3.

The devices which will be described in conjunction with the figures are intended to shape signals of the type represented in FIGS. 2a, 4a and 8a, that is to say signals exhibiting porches 10, 12, 14, 16 and 18 of relatively constant levels between two transitions but which may take diverse values.

Thus, it may be seen that the low porches 10, 14 and 18 have different values. Likewise, the high porches 12 and 16 have different values. The transitions 11, 13, 15 and 17 between porches extend over relatively short durations with respect to the duration of the porches.

The purpose of the devices is to convert these signals into logic signals, that is to say into rectangular signals with a low porch 20 (FIG. 2d) which is always of the same level and a high porch 22 likewise always of the same level, the transition between porches 20 and 22 taking place almost instantaneously. The instants of these transitions between the porches 20 and 22 coincide, to within a slight delay, with the moment at which the signal 36 to be converted exhibits a transition between porches and at which this signal between two porches reaches a level equal to the average value between the levels of these two constituent porches.

Figure 2A:
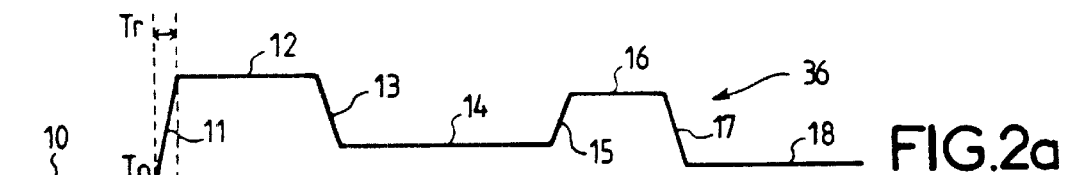
FIGS. 2a to 2e are charts showing the manner of operation of the device of FIG. 1.
Figure 2B:
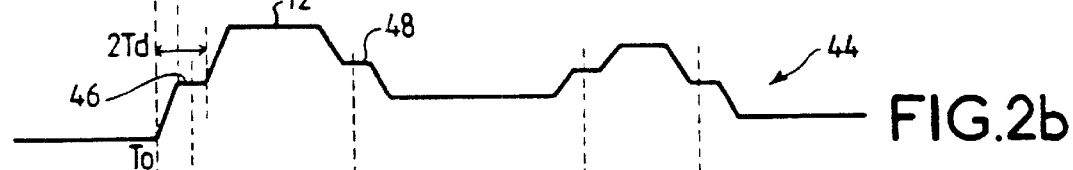
Figure 2C:
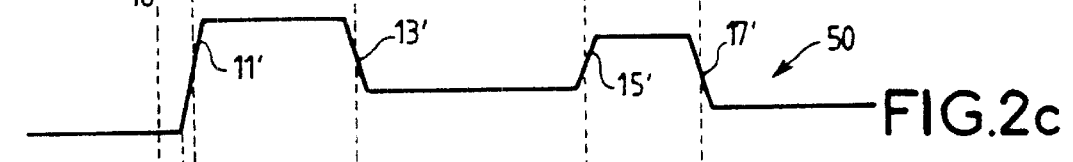
Figure 2D:
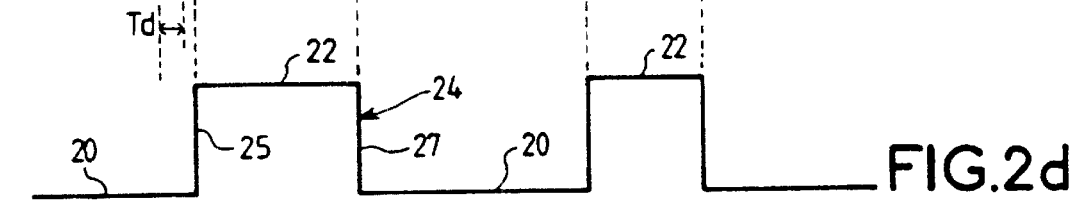

Thus, the first rectangular signal 24 represented in FIG. 2d exhibits a rising edge 25 which occurs at an instant corresponding substantially to that for which the rising transition 11 (FIG. 2a) takes a value substantially equal to the mean value between the levels $V_{10}$ and $V_{12}$ of the porches, respectively 10 and 12. Likewise, the falling edge 27 of the rectangular signal 24 appears at an instant corresponding substantially to that for which the falling transition 13 (FIG. 2a) between the porches 12 and 14 takes substantially a value equal to the mean value between the levels $V_{12}$ and $V_{14}$ of the porches, respectively 12 and 14.

Figure 1:
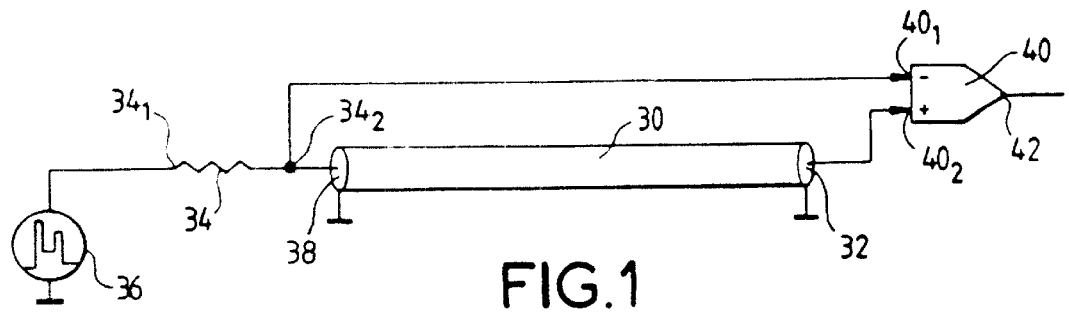
FIG. 1 is a diagram of a shaping device according to the invention.

Reference will firstly be made to FIG. 1.

In this embodiment, the device includes a transmission line 30, which is not matched at its output end 32. The device also includes a resistor 34 of value substantially equal to the characteristic impedance Zc of the line 30 whose first end $34_1$ receives the signal 36 to be shaped and whose second end $34_2$ is connected to the input 38 of the line 30 as well as to the first (−) input $40_1$ of a comparator 40 whose (+) input $40_2$ is linked to the output 32 of the line 30.

It is the output 42 of the comparator 40 which supplies the shaped signal (FIG. 2d).

The manner of operation is as follows:

The signal appearing at the input of the line 30, and therefore on the (−) input $40_1$ of the comparator 40, is represented in FIG. 2b, whilst the signal appearing at the output 32 of the line 30, and therefore on the (+) input $40_2$ of the comparator 40, is represented by FIG. 2c.

The propagation time Td of the line 30 is chosen in such a way that it always satisfies the following inequality:

$$2Td > Tr$$

In this inequality, Tr is the maximum allowable time for a transition between the porches of the input signal 36, such as the transition 11 between the porches 10 and 12, (FIG. 2a). Stated otherwise, the transmission line will be chosen as a function of the nature of the signal 36 to be converted. It is also possible to choose a transmission line 30, or delay line, such that the value of the propagation time, or delay, is adjustable.

The signal 44 appearing on the input 38 of the line 30, and therefore on the input $40_1$ of the comparator 40, is the sum of two signals, namely:

- an incident wave in phase with the wave 36 applied to the input $34_1$ of the resistor 34, but of half the amplitude of this wave 36, and
- a reflected wave identical to the incident wave, but delayed by the duration 2Td with respect to this incident wave.

The reflected wave results from the total reflection off the open circuit at the end 32 of line 30.

The (peak-to-peak) amplitude of the reflected wave is, like the amplitude of the incident wave, of an amplitude equal to half the amplitude of the signal 36.

The sum signal 44 represented in FIG. 2b thus includes porches 46, 48, etc. corresponding to the arithmetic mean value between the porches 10, 12; 12, 14, etc. of the signal 36.

The porch 46 corresponds to the amplitude of the incident wave, after the rise time Tr (equal to the rise time Tr of the signal 36 in the course of the transition 11, from the porch 10 to the porch 12), before the reflected wave appears, that is to say before the instant 2Td following the incident To of the start of the transition 11. This porch 46 therefore has half the amplitude of the amplitude of the signal 36, that is to say the mean value between the levels of the porches 10 and 12. The porch 46 terminates at the instant 2Td. The second porch of the sum signal 44 has the same level as the porch 12 and appears at the instant 2Td+Tr.

The intermediate porches 46, 48, etc. occur simultaneously with the appearance of the transitions 11', 13', etc. of the signal 50—delayed by the duration Td with respect to the signal 36—which appears on the output of the line 30 (and therefore at the input $40_2$ of the comparator 40). Under these conditions, the porch 46 causes a toggling of the signal on the output 42 of the comparator 40 from the low state 20 to the high state 22 when the level of the signal 50 reaches the mean value between the levels $V_{10}$ and $V_{12}$ of the porches 10 and 12.

Thus, the rectangular signal (FIG. 2d) corresponds to the signal 36 shaped but delayed by the duration Td.

Figure 2E:
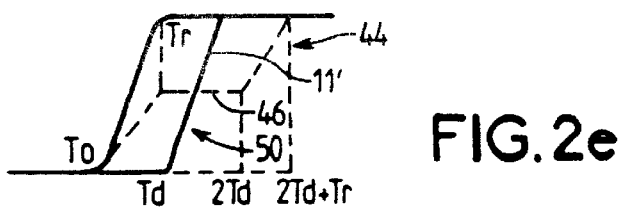

The manner of operation of the device is also apparent with FIG. 2e in which are represented the various signals 36, 44 and 50 in respect of the transitions 11 (signal 36) and 11' (signal 50).

To construct the line 30, one of the following elements may be chosen: a coaxial cable, a microstrip line, a strip line, a passive or active delay line.

Figure 3:
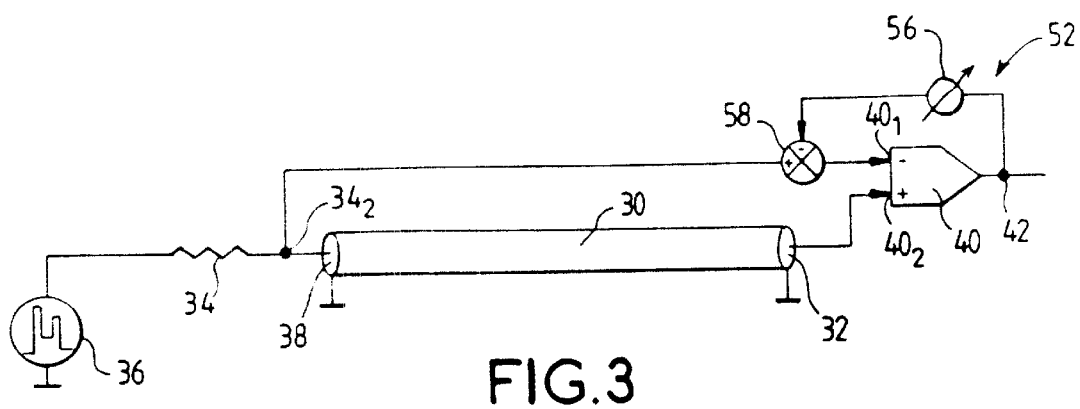
FIG. 3 is a diagram similar to that of FIG. 1 in respect of a variant.
Figure 5:
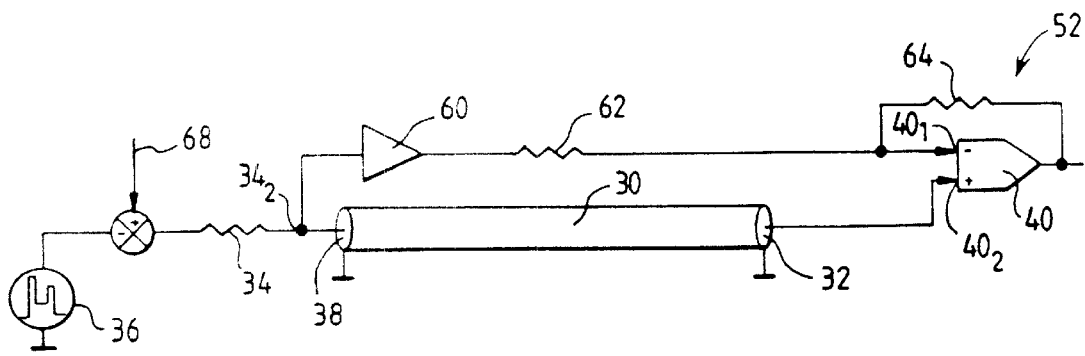
FIG. 5 is a diagram of a shaping device corresponding to a variant of the device represented in FIG. 3.

The embodiments of the invention which will now be described in conjunction with FIGS. 3, 5 and 7 are based on the same principle as the embodiment represented in FIG. 1, but they include arrangements making it possible to prevent unwanted togglings of the comparator 40 outside of the transition regions 11', 13', 15', 17' of the signal 50.

Specifically, the signals on the inputs $40_1$ and $40_2$ of the comparator 40 of FIG. 1 exhibit equal values, those of the porches 10, 12, 14, 16, 18, outside of these transition periods. Under these conditions, the noise, the offsets or the drifting of the signals may induce unwanted togglings.

In the examples represented in FIGS. 3 and 5, a small offset is added on the (−) input $40_1$ of the comparator 40 when the output 42 is at the low level and a small offset is deducted when the output 42 is at the high level. For this purpose, use is made of a hysteresis setup which, in its simplest embodiment represented in FIG. 3, consists of a feedback circuit 52 linking the output 42 of the comparator 40 to the (−) input $40_1$ of the comparator.

In this example, the lower porch 20 of the rectangular signal on the output 42 of the comparator 40 (FIG. 4c) is negative whilst the upper porch 22 of this same rectangular signal is positive.

The circuit 52 comprises an attenuator 56 which brings the attenuated signal originating from the output 42 to the (−) input of an adder/substracter circuit 58 making it possible to superimpose this feedback signal on the signal originating from the terminal $34_2$ of the resistor 34, that is to say originating from the input 38 of the line 30.

Thus, when the output signal from the comparator 40 is the negative signal 20, the signal brought by the feedback circuit 52 and the adder/subtracter 58 to the input $40_1$ is a positive signal. Under these conditions, before the toggling, the signal $44_1$ applied to the input $40_1$ is offset towards the positive values by an offset d (FIG. 4b).

When the signal on the output 42 exhibits the positive value 22, a negative signal is brought to the input $40_1$ by the feedback circuit 52 and the adder/subtracter 58. Under these conditions, the signal $44_1$ is shifted by an offset d' downwards (towards the negative values).

Figure 4B:
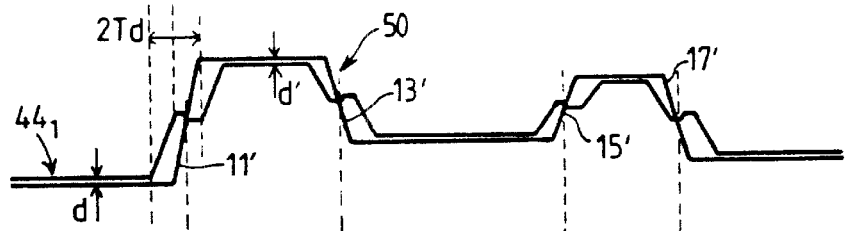
Figure 4C:
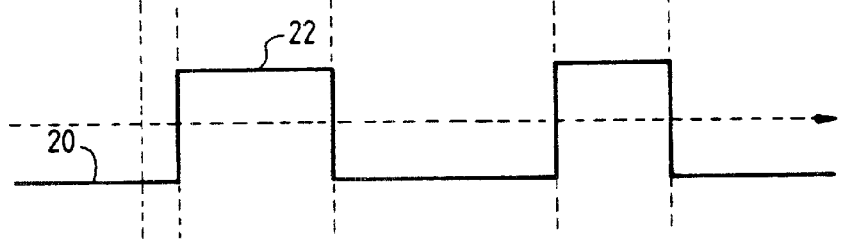

In FIG. 4b are represented the signals $44_1$ and 50, the signal 50 being the signal on the (+) input $40_2$ of the comparator 40. It may be seen in this figure that the output from the comparator 40 toggles from the low state 20 to a high state 22 when the signal 50 reaches the value:

$$V_{50} = \frac{V_{10} + V_{12}}{2} + d.$$

The output signal from the comparator 40 toggles from the high state 22 to the low state 20 when the signal 50 falls below the value $V_{50}$ such that:

$$V_{50} = \frac{V_{10} + V_{12}}{2} - d$$

It may thus be seen that the setup used together with the feedback circuit 52 imparts hysteresis properties to the comparator, given that the upward toggling takes place at a different value from the downward toggling.

The shift d or d' is preferably adjustable and its value will be chosen as a function of the following parameters:
signal-to-noise ratio of the input signal 36 and/or level of the glitches superimposed on the porches 10, 12, etc. of this input signal 36;
the input shift or drifting of the comparator;
drifting in gain and offsets in components (not shown) which may be used in the circuit, especially between the output 32 of the line 30 and the input $40_2$ of the comparator 40 and between the terminal $34_2$ and the input $40_1$ of the comparator.

FIG. 5 corresponds to a variant of FIG. 3. In this variant, a follower 60 and a resistor 62 of value $R_1$ which is large with respect to the characteristic impedance Zc of the line 30 are provided between the terminal $34_2$ and the input $40_1$ of the comparator 40. The feedback circuit 52 includes a resistor 64 of value $R_2$ which is large with respect to the value of $R_1$.

Moreover, upstream of the resistor 34 an offset 68 whose role will be explained later is added to the input signal 36.

Under these conditions, the signal on the input $40_1$ has the value:

$$V_{40_1} = \alpha V_b + (1-\alpha)V_{42}$$

In this formula, $V_b$ is the amplitude of the signal at the point $34_2$, $V_{42}$ the output signal from the comparator 40, and $\alpha$ has the following value:

$$\alpha = \frac{R_2}{R_1 + R_2}.$$

It may be seen that, under these conditions, the value $\alpha$ is close to 1 and that the hysteresis introduced by the circuit 52 is relatively small.

The follower 60 is necessary especially when it is not possible to obtain the conditions according to which $R_1$ is large with respect to Zc and $R_2$ is large with respect to $R_1$. In this case, the follower 60 affords great insulation.

The offset 68 superimposed on the signal 36 has the value:

$$V_{68} = \frac{V_{20} + V_{22}}{2} - V_M$$

In this formula, $V_{20}$ is the output voltage delivered at the low state by the generator, $V_{22}$ the output voltage at the high state of the comparator and $V_M$ is the average value of the minimum and maximum levels of the signal 36.

With this offset, values which are substantially equal to the shifts d and d' of the hysteresis are imparted.

Figure 6:
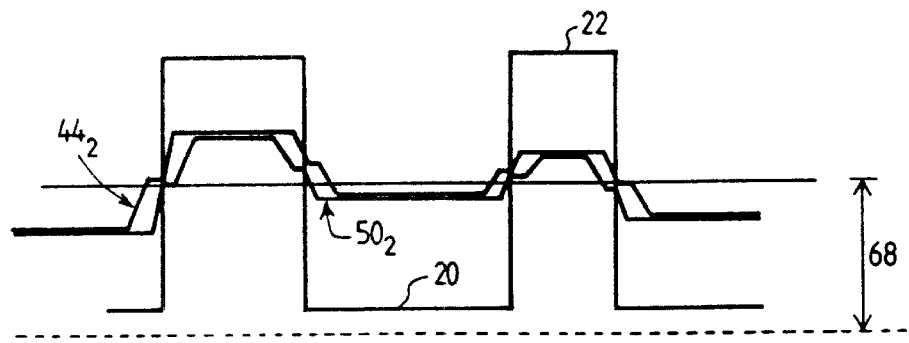
FIG. 6 is a chart serving to explain the manner of operation of the device represented in FIG. 5.

In FIG. 6 have been represented the rectangular signals obtained at the output of the comparator 40, the signal $44_2$ on the input $40_1$ of the comparator, the signal $50_2$ on the input $40_2$ of this same comparator as well as the offset 68 applied to the signal 36.

As a variant, instead of a resistor 62 between the terminal $34_2$ and the input $40_1$, a resistor (not shown), likewise of large value with respect to the characteristic impedance of the line 30, as well as a follower are provided in the path linking the output 32 of the line 30 to the input $40_2$ of the comparator 40.

Reference will now be made to FIGS. 7, and 8a to 8f which represent another embodiment of the invention making it possible to ensure that the comparator 40 does not toggle in an unwanted manner.

In this embodiment, the toggling of the comparator 40 is precluded outside of the periods of transition 11', 13', etc. of the signal 50 applied to the input $40_2$ of the comparator.

In other words, the comparator 40 can toggle only during an enabling window centred around the transitions 11' 13', etc.

In the example, to create this enabling window, a circuit 80 is provided, the input 82 of which receives the signal 36 and the output 84 of which delivers the signal for enabling the operation of the comparator 40.

This circuit 80 comprises, in the example, a differentiator circuit with capacitor 86 and resistor 88. A signal which is the derivative of the signal 36 and which is applied to the (−) input of a comparator 92 appears on the terminal 90 which is common to the capacitor and to the resistor.

The derivative signal 94 is represented in FIG. 8b. It is formed of a porch of zero level corresponding to the porches 10, 12, 14, etc. of the signal 36 and of plateaux 96, 98, 100, which are positive or negative depending on whether the corresponding transitions are rising or falling. The levels of these plateaux depend on the slope of the transition.

Moreover, a reference voltage $V_{ref}$ is applied to the terminal of the resistor 88 which is opposite the terminal 90. This voltage is added to a signal dependent on the output signal from the comparator 92 and the sum signal is applied to the (+) input of the comparator 92 which is hysteresis-mounted, a feedback circuit 102 being provided between the output of this comparator 92 and its (+) input.

The signal 104 at the (+) input of the comparator 92 is also represented in FIG. 8b.

The signal 106 (FIG. 8c) at the output of the comparator 92 is applied, on the one hand, to the first input 110 of an exclusive OR gate 112 by way of a delay line 114 and, on the other hand, directly to another input 116 of the exclusive OR gate 112. The output of the exclusive OR gate 112 is linked to the output 84 of the circuit 80.

The delay time T_val of the circuit 114 is less than 2Td, that is to say less than twice the time of propagation in the line 30.

The manner of operation is the following:

The output signal 106 from the comparator 92 is in the high state in the course of the porch 10 of the signal 36, since the signal 104 at the (+) input of the comparator 92 is, in this situation, greater than zero (value of the derivative of a constant porch).

During the rising transition 11 of the signal 36, the plateau 96, whose value then exceeds the amplitude of the signal 104, appears on the (−) input of the comparator 92. Under these conditions, the signal 106 at the output of the comparator 92 switches to the low state. However, this transition 114 does not occur immediately on the appearance 116 of the plateau 96 but with a delay due to the propagation time of the comparator.

The low state of the output of the comparator 92 is chosen so that a signal less than zero appears on the (+) input of this comparator. Under these conditions, for the duration of the porch 12 of the signal 36, the signal 106 remains in the low state.

The signal 106 reverts to the high state during the appearance of the negative plateau 98 corresponding to the falling transition 13 of the signal 36.

In this case, likewise, the toggling of the output signal 106 from the comparator 92 does not occur immediately on the appearance 118 of the negative plateau 98 but with a delay determined by the propagation time of the comparator.

In FIGS. 8c and 8d are represented the signal 106 applied to the input 116 of the exclusive OR gate 112 and the signal 120 applied to the input 110 of this gate 112. This signal 120 corresponds to the signal 106 but with a delay T_val. Under these conditions, the signal 122 on the output of the gate 112, which signal is represented in FIG. 8e, is formed of positive pulses appearing when the signals 106 and 120 exhibit different values.

Each pulse 124 of the signal 122 enables the comparator 40. Thus, upon the appearance of a pulse 124, the comparator 40 operates normally, that is to say its output signal 42 depends only on the signals applied to its (+) 40₂ and (-) 40₁ inputs. Outside of the enabling periods 124, the comparator 40 is latched, that is to say the signal on its output 42 is independent of the signals applied to its inputs 40₁ and 40₂. This signal on the output 42 retains the value which it had before the latching.

The values of T_val and of the hysteresis are chosen in such a way that the pulses 124 bracket the transitions 11' and 13', etc. of the signal 50 appearing on the input 40₂ of the comparator 40 (FIG. 8f).

The use of a comparator 92 with hysteresis imparts two useful properties on the setup. The first is that the comparator 40 is prevented from being enabled when several transitions of like direction follow one another. The second is that the enabling of the comparator 40 is prevented for the transitions having small slope (that is to say having small amplitude) of the signal 36.

As regards the first property: it may be seen that, for example, if after the transition 13, in the course of the porch 14, another falling transition occurs (not shown), this transition results in a negative plateau 130 (represented by dashes in FIG. 8b) and this negative plateau will not in this case modify the output signal from the comparator 92.

As regards the second property: it may be seen that if, in the course of the porch 18, a transition having small slope (not represented) occurs, this transition will result in a plateau 132 (represented by dashes in FIG. 8b) of the signal 94 of amplitude less than the amplitude of the signal 104 on the (+) input of the comparator 92. This plateau 132 will therefore not be capable of causing the signal on the output of the comparator 92 to toggle.

Thus, inadvertent triggering which would be due to noise superimposed on the signal 36 is prevented.

What is claimed is:

1. Process for converting a signal exhibiting alternating rising and falling transitions with porches between two transitions, into a rectangular signal exhibiting a single low value and a single high value, said process comprising the steps of:
   determining a threshold on each transition of the signal to be converted; and
   switching the signal from the low value to the high value or conversely in response to the signal to be transformed exceeding the threshold or falling below the threshold, wherein, in order to determine the instant of transition from the low value to the high value, or vice versa, of the rectangular signal, on each transition of the signal to be converted, the value of the threshold is maintained for a first duration from the start of the porch of the signal to be converted which occurs after the transition, and the threshold is compared with the transition of the signal to be converted, delayed by a second duration, such that the first duration is greater than the second duration and the first and second durations being chosen in such a way that the threshold occurs in the middle region of the signal to be converted, delayed by the second duration.

2. Process according to claim 1, wherein the threshold is maintained up to an instant which corresponds to twice the second duration after the transition of the signal to be converted.

3. Process according to claim 1, wherein, in order to produce the threshold, a signal is produced which is formed from the sum, on the one hand, of a first signal in phase with the signal to be converted, but of half the amplitude and, on the other hand, of a second signal identical to this first in-phase signal, but delayed by a duration which is greater than the largest of the durations of transition allowable for the signal to be converted.

4. Device using a threshold for converting a signal exhibiting alternating rising and falling transitions into a rectangular signal exhibiting a single low value and a single high value and comprising:
   a transmission line or delay line, having an input for receiving the signal to be converted by way of an impedance of value substantially equal to a characteristic impedance of the transmission line or delay line, the characteristic impedance being not matched at an output of the transmission line or delay line, and the transmission line or delay line having a propagation time Td from the input to the output such that 2Td >Tr, Tr being the maximum allowable time for a transition; and
   a first comparator whose first and second inputs are coupled respectively to the input and to the output of the transmission line or delay line.

5. Device according to claim 4, further comprising means for preventing the toggling of a signal on an output of the first comparator outside of the falling and rising transitions of a delayed signal to be compared with the threshold.

6. Device according to claim 5, further comprising means for adding a value to the signal on one of the inputs of the first comparator, the value making it possible to confirm the output signal from the first comparator, outside of the falling and rising transitions of the delayed signal to be converted.

7. Device according to claim 6, wherein the means for preventing the toggling comprises a feedback circuit coupled between the output of the first comparator and an input of the first comparator.

8. Device according to claim 7, wherein the means for adding a value comprises an adder/subtractor and wherein the feedback circuit includes an attenuator provided between the output of the first comparator and the adder/subtractor, the attenuator being preferably adjustable.

9. Device according to claim 6, wherein the means for adding a value comprises means for superimposing an offset signal onto the signal to be converted so that the values or shifts confirming the output signal from the first comparator are substantially symmetric with respect to the average output signal from the comparator.

10. Device according to claim 5, wherein the means for preventing toggling outside of the falling and rising transitions enables the first comparator for allowing a toggling of the signal on the output of the first comparator only during transitions of the delayed signal to be converted, and disables the first comparator outside of the falling and rising transitions for preventing the toggling.

11. Device according to claim 10, wherein the first comparator is disabled in response to a transition of the signal to be converted which has the same direction as an immediately preceding transition.

12. Device according to claim 10, wherein the first comparator is disabled in response to a transition for which the amplitude of the transition is less than a determined value.

13. Device according to claim 10, further comprising a differentiator for differentiating the signal to be converted to produce a differentiated signal and a second comparator for comparing the differentiated signal with a reference, the differentiator being coupled between an input receiving the signal to be converted and an input of the second comparator.

14. Device according to claim 13, wherein the means for preventing toggling operates responsive to an output signal from the second comparator for creating a pulse for enabling the first comparator, the pulse having a startup instant and a duration which are such that the enabling of the first comparator occurs only during the periods of transition of the delayed signal to be converted.

15. Device according to claim 14, wherein the means for preventing toggling comprises an exclusive OR gate for providing the enabling pulse, a first input of the exclusive OR gate being coupled to the output of the second comparator and the second input of the exclusive OR gate being coupled to the output of the second comparator by way of a delay element.

* * * * *